United States Patent
Hale

(10) Patent No.: US 10,581,255 B2
(45) Date of Patent: Mar. 3, 2020

(54) LITHIUM-SULFUR BATTERY MANAGEMENT SYSTEM

(71) Applicant: Oxis Energy Limited, Abingdon-On-Thames (GB)

(72) Inventor: Christopher Hale, Abingdon (GB)

(73) Assignee: Oxis Energy Limited, Abingdon-On-Thames (GB)

(*) Notice: Subject to any disclaimer, the term of this patent is extended or adjusted under 35 U.S.C. 154(b) by 23 days.

(21) Appl. No.: 16/060,003

(22) PCT Filed: Nov. 30, 2016

(86) PCT No.: PCT/EP2016/079172
§ 371 (c)(1),
(2) Date: Jun. 6, 2018

(87) PCT Pub. No.: WO2017/102318
PCT Pub. Date: Jun. 22, 2017

(65) Prior Publication Data
US 2018/0366957 A1    Dec. 20, 2018

(30) Foreign Application Priority Data
Dec. 18, 2015 (EP) .................................. 15201034

(51) Int. Cl.
*H02J 7/00* (2006.01)
*G01R 31/3842* (2019.01)
(Continued)

(52) U.S. Cl.
CPC .......... *H02J 7/0021* (2013.01); *G01R 31/387* (2019.01); *G01R 31/3842* (2019.01);
(Continued)

(58) Field of Classification Search
CPC ..................................................... H02J 7/0021
(Continued)

(56) References Cited

U.S. PATENT DOCUMENTS

| 7,250,233 B2 | 7/2007 | Choi et al. |
| 2006/0238203 A1 | 10/2006 | Kelley et al. |

(Continued)

FOREIGN PATENT DOCUMENTS

| CN | 204794271 U | 11/2015 |
| TW | 489540 | 6/2002 |

(Continued)

OTHER PUBLICATIONS

Taiwan Intellectual Property Office, Search Report for TW 105140597, dated Oct. 14, 2019, 1 page.

*Primary Examiner* — Edward Tso
*Assistant Examiner* — Ahmed H Omar
(74) *Attorney, Agent, or Firm* — Mintz Levin Cohn Ferris Glovsky and Popeo, P.C.

(57) ABSTRACT

There is provided a Lithium-Sulfur battery management system for determining a state of charge of a Lithium-Sulfur battery (LS1). The management system comprises a first circuit having at least one reactive element (Cb), and the first circuit is configured to discharge and charge fixed amounts of charge from and to the battery (LS1) via the at least one reactive element (Cb). The management system also comprises a second circuit (DA1, MC1) for monitoring the discharging and charging, and the second circuit is configured to measure the discharge time and the charge time of the fixed amounts of charge, and determine the state of charge based on those times. There is further provided a method for determining the state of charge of the Lithium-Sulfur battery.

15 Claims, 4 Drawing Sheets

(51) Int. Cl.
*G01R 31/387* (2019.01)
*G01R 31/392* (2019.01)
*G01R 31/378* (2019.01)
*G01R 31/385* (2019.01)
*G01R 31/367* (2019.01)
*H01M 10/052* (2010.01)

(52) U.S. Cl.
CPC .......... *G01R 31/367* (2019.01); *G01R 31/378* (2019.01); *G01R 31/386* (2019.01); *G01R 31/392* (2019.01); *H01M 10/052* (2013.01); *H02J 2007/005* (2013.01); *Y02T 10/7055* (2013.01)

(58) Field of Classification Search
USPC .......................................................... 320/134
See application file for complete search history.

(56) References Cited

U.S. PATENT DOCUMENTS

| | | |
|---|---|---|
| 2009/0055110 A1 | 2/2009 | Kelley et al. |
| 2009/0174410 A1* | 7/2009 | Kim .................. G01R 31/3835 |
| | | 324/426 |
| 2010/0121591 A1 | 5/2010 | Hall |
| 2013/0342169 A1 | 12/2013 | Joe et al. |
| 2015/0234014 A1 | 8/2015 | Moganty et al. |
| 2018/0095141 A1 | 4/2018 | Wild et al. |

FOREIGN PATENT DOCUMENTS

| | | |
|---|---|---|
| TW | 201121124 A | 6/2011 |
| TW | 201528650 A | 7/2015 |
| WO | WO 1997/030643 A1 | 8/1997 |

* cited by examiner

LITHIUM-SULFUR BATTERY MANAGEMENT SYSTEM

This application is a national-phase entry of Patent Cooperation Treaty Application No. PCT/EP2016/079172, entitled "LITHIUM-SULFUR BATTERY MANAGEMENT SYSTEM," which has an international filing date of Nov. 30, 2016, which claims priority benefit to European Patent Application No. 15201034.4 filed on Dec. 18, 2017, entitled "LITHIUM-SULFUR BATTERY MANAGEMENT SYSTEM," the contents of which are hereby incorporated by reference in their entirety.

TECHNICAL FIELD

The present invention relates generally to a Lithium-Sulfur battery management system for determining the state of charge of a Lithium-Sulfur battery.

BACKGROUND OF THE INVENTION

The ability to reliably determine the amount of remaining charge of a battery for use as a power source in, for example, portable electronic goods and electric vehicle transport is highly valued by manufacturers and consumers alike in order to calculate the remaining usage time or available distance for vehicles.

In the case of gasoline vehicles the fuel level can simply be measured, however in electric and hybrid vehicles and in electronic devices because the battery is used as their power source it is more difficult to measure residual energy accumulated in the battery. The state of charge (SOC) of a battery may for example be expressed as a percentage indicator of the amount of capacity remaining in a battery until a recharge is needed, compared to the total capacity provided by that battery.

Supposing $SOC_0$ to be the initial SOC percentage at time $t_0$, the battery's SOC percentage at time t is defined as:

$$SOC = SOC_0 + 100 * \int_{t_0}^{t} \frac{I(t)}{Qt} dt$$

where I is the current, which is defined as negative for discharging and positive for charging, and $Q_t$ is the battery's maximum capacity in Ah.

The initial $SOC_0$ where the battery is considered to be fully charged may be set with reference to the maximum open circuit voltage (OCV) prior to discharging the battery, optionally with reference to resistance and temperature measurements to improve accuracy.

Common methods of gauging the SOC of batteries of various chemistries are based on voltage measurements, where typically the voltage of a battery will fall in relation to its remaining capacity. However, the voltage of a Lithium-Sulfur battery does not drop linearly as the battery is discharged, and typically plateaus for large proportions of the discharge characteristic, meaning that the use of voltage is not well-suited to determining the SOC of Lithium-Sulfur batteries.

Another known method of determining SOC of the battery is to perform coulomb counting from the moment the battery begins to be discharged, so that the charge output by the battery is counted and the remaining charge still within the battery can be calculated. With any battery, coulomb counting is only practical if an initial capacity value is known prior to the start of any discharge, and if no other method of capacity estimation is used, then coulomb counting can only practically be implemented when the battery starts from 100% SOC. In practice a battery may not start its discharge from a fully charged state either because it has been subject to a partial discharge, has not been fully charged, or subject to self-discharge and therefore requires an additional method of determining the start of discharge capacity.

One characteristic of Lithium-Sulfur batteries that has been investigated as a means of SOC determination is a measurable relationship between a battery's internal resistance and its SOC, as identified in previous patent applications such as application US 2009/0055110 (Sion Power). Typically, determination of the battery's resistance is through applying a known current in either charge or discharge, monitoring the change in voltage, and applying specific algorithms to predict the battery SOC.

In practice, determination of the battery's resistance through application of a current source is not so straight forward, as identified in European Patent Application No. 1506497.5 (OXIS Energy et al), since there are other factors relating to the duration of an applied current pulse and response of the battery, used in determining the resistance. These factors are typically based on the characteristics of a Lithium-Sulfur battery under load (or charge). An attempt to address the issues of a Lithium-Sulfur battery's characteristics whilst under load has been addressed in the above mentioned European Patent Application No. 1506497.5 (OXIS Energy et al) using a process of Prediction Error Minimisation and Adaptive Neuro-Fuzzy Inference System SOC estimation, claiming a potential mean error in capacity determination of 5% and maximum error of 14%. However, implementation of this technique requires fairly sophisticated algorithms and suitable processing power to handle the number of calculations required.

It is therefore an object of the invention to provide an improved system for determining the SOC of a Lithium-Sulfur battery.

SUMMARY OF THE INVENTION

According to various embodiments of the invention, there is provided a Lithium-Sulfur battery management system for determining a state of charge of a Lithium-Sulfur battery, according to any one of the appended claims 1 to 14. The management system comprises a first circuit having at least one reactive element, and the first circuit is configured to discharge and charge fixed amounts of charge from and to the battery via the at least one reactive element. The management system also comprises a second circuit for monitoring the discharging and charging, and the second circuit is configured to measure the discharge time and the charge time of the fixed amounts of charge, and determine the state of charge based on those times.

Since the fixed charge is applied to and from the battery via the at least one reactive element, the time to discharge/charge the battery by a fixed amount of charge is a function of the internal resistance of the battery, since the rate of discharge/charge through the at least one reactive element will be moderated by the internal resistance. As noted further above, there is a relationship between SOC and internal resistance. Therefore, there is also a relationship between SOC and the discharge/charge times, allowing SOC to be determined from the discharge/charge times.

The internal resistance of a Lithium Sulfur battery with respect to a charge current for a given SOC, will differ to its internal resistance with respect to a discharge current at the same SOC. Additionally, the internal resistance under charging may not always provide an accurate SOC for all SOC's, and the internal resistance under discharging may not always provide an accurate SOC for all SOC's, however the combination of the internal resistance when discharging (by way of the discharge time) and the internal resistance when charging (by way of the charge time) allows an accurate SOC to be determined for all SOC's. This is discussed in more detail later on with reference to the discharging and charging characteristics shown in FIG. 1.

Preferably, the fixed amounts of charge comprise a first fixed amount of charge that is discharged from the battery during the discharge time, and a second fixed amount of charge that is charged into the battery during the charge time, wherein the first fixed amount of charge and the second fixed amount of charge are substantially a same value as one another such that the discharging and charging has no significant overall effect upon the state of charge of the battery. This process may be controlled automatically by electronics, without any significant overall impact on the battery's capacity, increasing the accuracy of the capacity estimation.

Advantageously, the least one reactive element may comprise a storage capacitor, and the size of the storage capacitor may fix the fixed amounts of charge that are discharged and charged from and to the battery. For example, doubling the size of the capacitor may double the fixed amount of charge, when all other factors are unchanged. The fixed amount of charge may be less than the maximum amount of charge the capacitor is able to store, for example if the capacitor is charged and discharged between 90% and 10% of its charge capacity. Preferably the capacitor is charged and discharged between less than 98% and greater than 2% of its capacity respectively, to avoid excessively long charge and discharge times. As will be apparent to those skilled in the art, if the battery was used to charge and discharge the capacitor between 100% and 0% of its capacity via the internal resistance of the battery, then this would take a very long time due to the exponential nature of the charge and discharge characteristics.

Since the time constant of charging a capacitor is based on its capacitance and an in line series resistance (RC time constant), in this case the storage capacitance in series with the internal battery resistance, the time to charge the storage capacitance between two states of charge, for example between 10% and 90%, will be representative of the internal resistance.

Optionally, the at least one reactive element may comprise an inductor connected to the storage capacitor. Then, the current that flows to and from the storage capacitor via the inductor may be measured. The rate of change of this current will depend on the internal resistance of the battery, and so the time for the current to transition between two different values can be measured to determine internal resistance and therefore SOC. Preferably, a current sense resistor is connected in series with the inductor, the voltage developed across the current sense resistor corresponding to the current flowing through the inductor, so that the current can be easily measured.

Advantageously, first circuit may comprise a step-up converter. Then, the storage capacitor may be charged from the battery whilst measuring the discharge time, and then using the step-up converter, the energy in the capacitor can be discharged back into the battery, whilst measuring the charge time. For example, the first circuit may comprise a switching network connected to the storage capacitor, the switching network configured to switch a first terminal of the storage capacitor between lower and higher voltage potentials to perform the discharging and charging of the battery via a second terminal of the storage capacitor. This switching may comprise switching a reservoir capacitor out of and into series with the storage capacitor to perform the discharging and charging of the battery respectively. The size of the reservoir capacitor is preferably much larger than the size of the storage capacitor, for example at least 20 times larger, more preferably 50 times larger, or 100 times larger.

To help improve the accuracy of the time measurements and reduce the influence of any noise in the system, the second circuit may be configured to repeatedly switch this switching network to discharge and charge the battery for a repetition number of times, and to determine the SOC based on a sum of the discharge times and a sum of the charge times, and optionally a sum of the discharge and charge times. The repetition number may for example be 10 times, or even 100 times. Further improvement to the accuracy of the capacity estimation may be by continuously monitoring the SoC of the battery whilst not in use and using algorithms and averaging techniques to track the deterioration of battery capacity for any period of self-discharge.

The second circuit may be configured to determine the SOC based on a look-up table that provides a state of charge value for each of multiple combinations of discharge and charge times. Therefore, the Lithium-Sulfur battery management system may not need to perform complex calculations in order to determine the SOC, but can simply look up the correct SOC from the look-up table based on the discharge and charge times. Preferably, the look-up table can be modified to take account of battery temperature, and so the Lithium-Sulfur battery management system may further comprise a third circuit configured to sense the temperature of the battery. The look-up table may also be modified to take account of battery ageing, which may be tracked as described in the paragraph above.

Advantageously, the second circuit may be configured to determine a health of the battery based on the sum of the discharge and charge times. The health may be determined by comparing the discharge and charge times to nominal reference lookup values, as well as to a log of previous discharge/charge times Vs SOC held in memory.

Given that the discharge and charge times are directly proportional to the battery resistance with respect to discharge and charge current for a fixed capacitance, the discharge times, a sum of the charge times, and a sum of the discharge and charge times may be compared to a look up table to determine SOC. Clearly, instead of modifying the look-up table according to temperature and battery ageing, the look-up table may remain the same and the sums of the charge and discharge times may be modified according to temperature and battery ageing prior to comparing to the look-up table. The effects of temperature and battery ageing upon Lithium Sulfur batteries are well-known in the art, and so are not described in detail herein.

Alternatively, the SOC may be calculated based on predetermined formulas specifying relationships between the SOC and the discharge and charge times, rather than using a look-up table.

The second circuit may be configured to monitor a voltage difference between two points of the first circuit, determine that discharging or charging is sufficiently complete when the voltage difference drops below a predetermined level, and in response switch the first circuit from discharging to charging, or charging to discharging, respectively. For example, the second circuit may determine that discharging is complete when the voltage across the current sense resistor connected in series with the inductor falls below a predetermined level, or may determine that charging is complete when the voltage across the storage capacitor falls below a predetermined level, depending on whether the two points are across the current sense resistor or the storage capacitor. Conversely, the second circuit may determine that discharging is complete when the voltage across the storage capacitor rises above a predetermined level, or may determine that charging is complete when the voltage across the current sense resistor connected in series with the inductor rises above a predetermined level, noting that the voltage will be rising towards zero from a negative value given that current flows through the current sense resistor is in the opposite direction when charging compared to discharging. Clearly the difference amplifier could be connected across two other points of the first circuit instead of across the storage capacitor or across a current sense resistor, provided that the two points exhibit a voltage difference variation corresponding to a time constant of the at least one reactive element.

Advantageously, an output of the difference amplifier may be connected to a control terminal of the switching network, to switch between discharging and charging the battery based on the output of the difference amplifier. This provides analogue and therefore fast feedback to the switching network, so that the switch between discharging and charging is executed without delay.

There is further provided a method for determining SOC of a Lithium-Sulfur battery, according to the appended claim 15. The method comprises measuring a first time to discharge the Lithium-Sulfur battery by a first fixed amount of charge, via a first reactive element; measuring a second time to charge the Lithium-Sulfur battery by second fixed amount of charge, via a second reactive element; and determining the state of charge based on the first and second times. The first reactive element is optionally a same reactive element as the second reactive element, and the first fixed charge is optionally a same amount of charge as the second fixed charge. Optionally, the second time may take place at a time earlier than the first time.

This disclosure refers to discharging and charging the battery, although this does not imply any requirement for the discharging to take place before the charging, and the charging may take place before the discharging if desired. By convention, charge is considered to flow from relatively higher voltage potential to relatively lower voltage potential.

DETAILED DESCRIPTION

Embodiments of the invention will now be described by way of non-limiting example only and with reference to the accompanying drawings, in which.

The figures are not to scale, and same or similar reference signs denote same or similar features.

Figure 1:
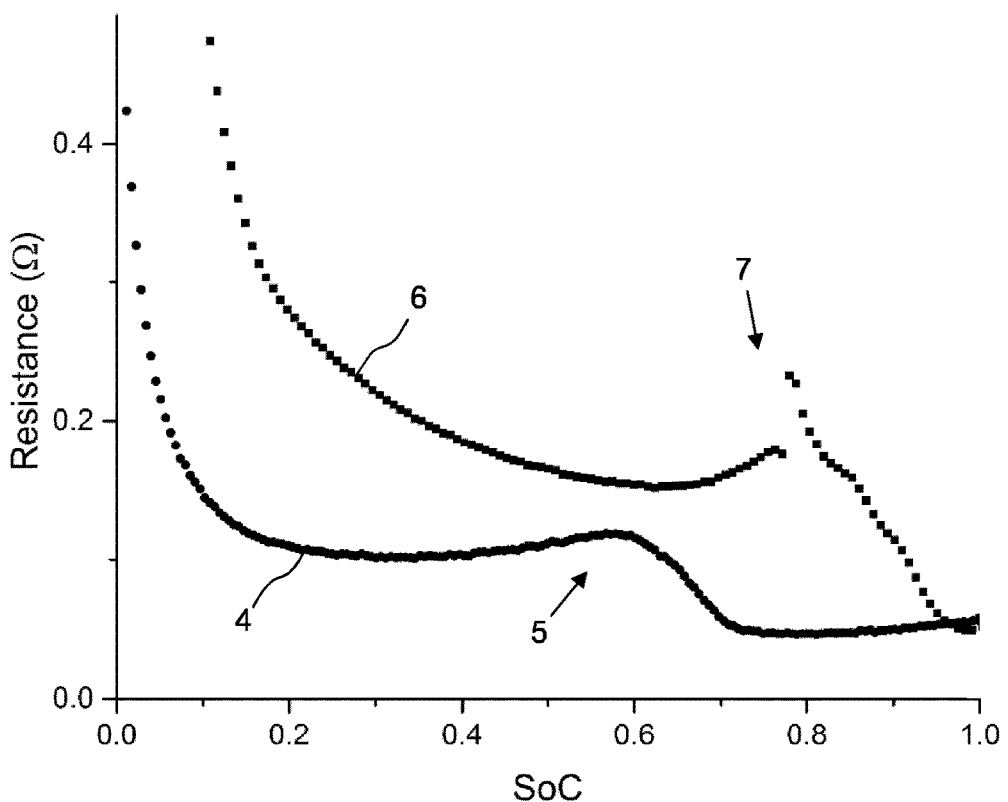
FIG. 1 shows a graph of battery internal resistance characteristics during charging and discharging of a typical Lithium Sulfur battery.

Referring to FIG. 1, there is shown a graph of battery internal resistance against SOC, showing how the internal resistance of a typical Lithium Sulfur battery generally decreases as it's SOC increases from 0 (0% charged) to 1.0 (100% charged). The graph includes a curve 4 of measurement results when charging the battery, and a curve 6 of measurement results when discharging the battery. It can be seen that the internal resistance of the battery is higher when the battery is being discharged, than when the battery is being charged.

The charging curve 4 has a kink 5 at around 60% SOC, meaning the charging curve alone does not unambiguously allow the SOC to be determined for any given measured resistance value, for example a measured resistance value of 0.11 Ohm under charging could correspond to an SOC of roughly 50%, or an SOC of roughly 62%, depending on which side of the kink 5 the measurement result actually corresponded to. The discharge curve 6 has a kink 7 at around 80% SOC, causing similar problems to the kink 5. However, since these kinks occur at different points along the SOC curves 4 and 6, the inventors have recognised that resistance measurements taken under both charge and discharge can be used in combination with one another to help unambiguously identify the SOC of a battery being tested. For example, returning to the example measurement result of 0.11 Ohm under charging, the resistance under discharge could be measured as well, in order to determine whether the measurement result of 0.11 Ohm under charging corresponds to a point before or after the kink 5, corresponding to either 50% SOC or a 62% SOC. The charge and discharge times measured in the present invention are directly proportional to the charge and discharge internal resistances of the battery, allowing the SOC to be determined based on the charge and discharge times.

Figure 2:
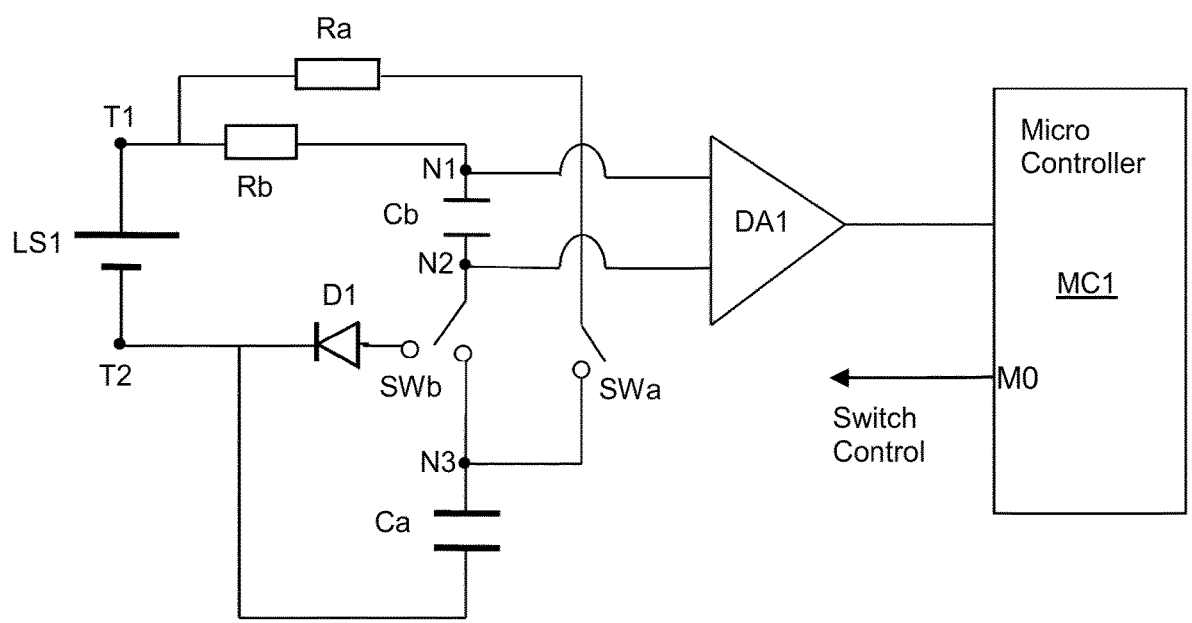
FIG. 2 shows a schematic diagram of a battery management system according to a first embodiment of the invention.
Figure 3:
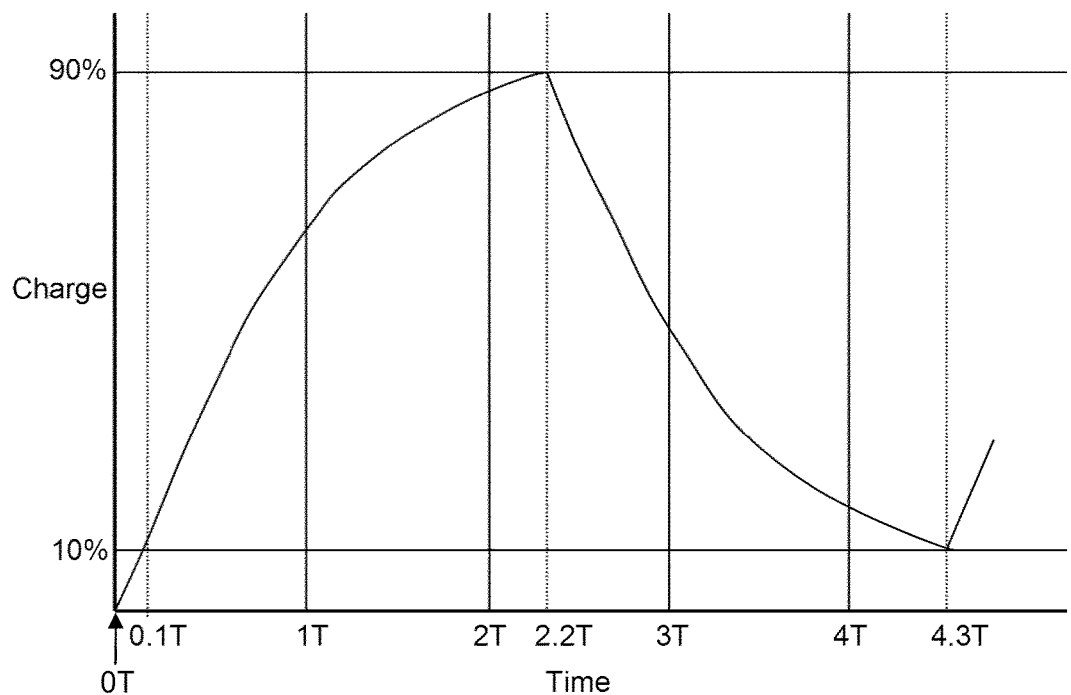
FIG. 3 shows a timing diagram of levels of charge held by a capacitor of the system of FIG. 2 during charging and discharging the battery.

A first embodiment of the invention will now be described with reference to FIG. 2 and FIG. 3. FIG. 2 shows a schematic diagram of a battery management system connected to positive and negative terminals T1 and T2 of a Lithium Sulphur battery LS1. In this embodiment, the Lithium Sulphur battery LS1 consists of a single cell, however it will be appreciated that multiple cells could be combined in series and/or parallel with one another within the battery LS1 in alternate embodiments. The battery management system comprises a first circuit formed by resistors Ra and Rb, capacitors Ca and Cb, switches SWa and SWb, and a diode D1. The capacitor Cb is considered to be a storage capacitor, since it is used to store charged discharged from the battery LS1, prior to charging that charge back into the battery LS1. The storage capacitor Cb has two terminals, N1 and N2. The terminal N1 is connected to the positive battery terminal T1 via the resistor Rb, and the switch SWb connects the terminal N2 to either the negative battery terminal T2 (via the diode D1), or to a terminal N3 of the capacitor Ca.

The capacitor Ca is considered to be a reservoir capacitor, since it is used to store a relatively large amount of charge, for raising and lowering the voltage of the storage capacitor terminal N2, to control whether the storage capacitor sends charge to, or receives charge from, the battery LS1.

The resistor Ra, the switch SWa, and the reservoir capacitor Ca are all connected in series with one another between the battery terminals T1 and T2, so that the switch SWa can be used to switch the reservoir capacitor Ca and resistor Ra into connection between the battery terminals T1 and T2, in order to charge the reservoir capacitor Ca up to the same voltage as the battery LS1. The resistor Ra has a small value, sufficient to prevent an excessively large current from flowing into the reservoir capacitor Ca when the switch SWa is first closed. The switch SWa is connected to terminal N3 of the reservoir capacitor Ca, between the reservoir capacitor Ca and the positive battery terminal T1.

The battery management system also comprises a second circuit, formed by a difference amplifier DA1 and a microcontroller MC1. The difference amplifier has two inputs connected to the terminals N1 and N2 of the storage capacitor, and monitors the voltage difference between those two terminals N1 and N2, and has an output connected to the microcontroller MC1. The microcontroller MC1 receives the output of the difference amplifier DA1, and generates switch control signals M0 based upon the output, for controlling the switches SWa and SWb.

In use, the microcontroller switch control M0 initially closes the switch SWa, and sets the switch SWb to connect the storage capacitor terminal N2 to the reservoir capacitor terminal N3. Then, the terminals T1 and T2 of the battery LS1 to be measured are connected into the circuit, as shown, and the battery LS1 charges the reservoir capacitor Ca up to the battery voltage, via the resistor Ra. Any residual charge in the storage capacitor Cb is discharged, since its terminals N1 and N2 are connected together via the switches SWa and SWb and the resistors Ra and Rb.

Once the reservoir capacitor Ca is substantially fully charged, at a time 0T, the switch SWa is opened and the switch SWb is switched to connect the terminal N2 of the storage capacitor to the negative terminal T2 of the battery via the diode D1. As shown in the timing diagram of FIG. 3, which shows the voltage between the storage capacitor terminals N1 and N2, this causes the storage capacitor Cb to charge up through the resistor Rb. The resistor Rb is small, and its purpose is to prevent an excessively large current from flowing from the battery LS1 when the storage capacitor Cb begins to charge. The rate of this charging is also limited by the internal resistance of the battery LS1, as will be apparent to those skilled in the art, and this internal resistance combines with the resistor Rb to form a series RC circuit with a time constant of T=Internal resistance+Rb) *Cb, as will also be apparent to the person skilled in the art. The x-axis of FIG. 2 is marked in terms of this time constant, and it can be seen on FIG. 2 that the storage capacitor Cb reaches 90% charge (a voltage that is 90% of the battery voltage) after 2.2T has elapsed.

This voltage across the storage capacitor Cb is measured by the difference amplifier DA1, and detected by the microcontroller MC1. When this voltage indicates the capacitor Cb is 10% charged, at 0.1T marked on FIG. 3, the microcontroller MC1 begins timing. When this voltage indicates the capacitor is 90% charged, at 2.2T marked on FIG. 3, the microcontroller stops timing, and stores this time as the discharge time that the battery spent discharging to charge the storage capacitor from 10% up to 90%. Additionally, the microcontroller MC1 changes the switch control output M0 to connect the terminal N2 of the storage capacitor Cb to the terminal N3 of the reservoir capacitor Ca. Since the reservoir capacitor Ca is already charged up to the battery voltage, this steps the voltage at the terminal N2 of storage capacitor Cb up to 100% of the battery voltage, and so steps the terminal N1 of the storage capacitor steps up to 190% of the battery voltage. The storage capacitor Cb then begins to discharge into the battery LS1 through the resistor Rb, charging the battery LS1. The microcontroller times this charging time, starting from 2.2T shown on FIG. 3.

After 4.3T, the output voltage of the difference amplifier DA1 indicates to the microcontroller that the voltage across the storage capacitor Cb has dropped to 10% charge (10% of the battery voltage), and the microcontroller stops timing the charging time. At this point, the microcontroller could use the discharge time from 0.1T to 2.2T, and the charge time from 2.2T to 4.3T, in a comparison with a look-up table to determine the SOC of the battery. Note that the value of T during 0.1T to 2.2T, will be different to the value of T during 2.2T to 4.3T, due to the different internal resistance of the battery under discharging and charging. Accordingly, the x-axis of the FIG. 3 graph is not entirely linear.

In this embodiment, instead of taking the discharge time and the charge time alone, the same discharge and charge cycle is carried out again, and again, for a repetition number of times. Then, all the discharge times can be summed, all the charge times can be summed, and all the discharge and charge times can be summed, to produce three values for comparing to a look-up table. This will average out the effects of any noise or measurement errors, and should produce a more accurate result. The number of discharge/charge cycles from which the SOC calculations will be made, will be dependent on the accuracy that is required, the number of battery cells connected in parallel with one another, and the impedance of the system, but may for example be between 10 to 100 discharge/charge cycles. The size of the reservoir capacitor Ca is preferably much larger than the size of the storage capacitor Cb, for example the reservoir capacitor Ca may be around 1 F, and the storage capacitor Cb may be around 10 mF. Then, multiple discharge/charge cycles can be carried out without the voltage across the reservoir capacitor varying significantly.

The look-up table may be initially constructed from a set of typical measurement results for Lithium Sulfur batteries, with techniques such as coulomb counting being used to determine what SOC typically corresponds to what discharge and charge times. Or, a full discharge cycle could be measured, with the 100% and 0% SOC states being used to interpolate what SOC the battery was at when each pair of discharge and charge times were measured.

A second embodiment of the invention will now be described with reference to FIG. 4, which shows a more detailed schematic diagram than that of FIG. 2. The main principle of operation of the second embodiment is the same as that of the first embodiment, with a terminal N5 of a storage capacitor C2 being connected and disconnected from a reservoir capacitor C1, to charge and discharge a Lithium Sulfur battery LS2 respectively.

Figure 4:
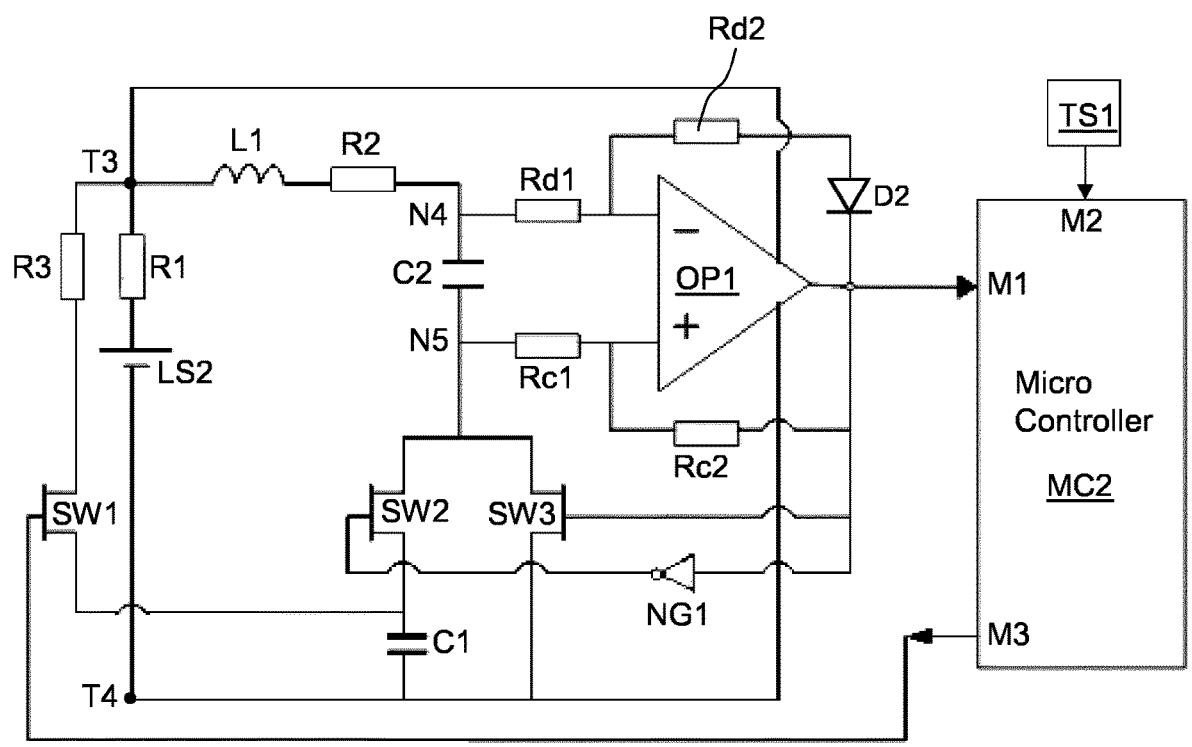
FIG. 4 shows a more detailed schematic diagram of a battery management system according to a second embodiment of the invention.

The schematic diagram of FIG. 4 explicitly represents the internal resistance of the battery LS2 with a resistor R1, which will vary under discharge and charge as shown in FIG. 1. The resistor R1 is connected in series between the positive and negative battery terminals T3 and T4. A microcontroller MC2 has an output M3 for controlling when the reservoir capacitor C1 is charged via the resistor R3, prior to the discharge/charge cycles, and an input M1 from an Op-Amp OP1 that forms a difference amplifier for measuring the voltage difference between the terminals N4 and N5 of the storage capacitor C2. The microcontroller MC2 monitors the input M1 to measure the lengths of the discharge and charge times, and calculates SOC of the battery LS2 based on those times.

The switching of the reservoir capacitor C1 out of and into series with the storage capacitor C2 is controlled by feedback from the output of the OP Amp OP1. The output of the OP Amp is connected directly to the gate of a switch transistor SW3, and connected to the gate of a switch transistor SW2 via a NOT gate NG1, such that the switch transistors SW2 and SW3 collectively form a single-pole double-throw switch similar to SWb of FIG. 2.

When the storage capacitor C2 is at 10% charge, at the beginning of the timed discharge period of the battery LS2, the voltage at terminal N5 is 0V and the voltage at terminal N4 is 10% of the battery voltage. The output of the OP Amp OP1 is the same as the battery voltage, and the switch SW2 is open and the switch SW3 is closed. At the end of the of the timed discharge period of the battery when the storage capacitor C2 is at 90% charge, the voltage at terminal N5 is 0V and the voltage at terminal N4 is 90% of the battery voltage, causing the OP Amp OP1 to flip its output from the battery voltage to 0V, which closes the switch SW2 and opens the switch SW3, starting the timed charge period of the battery LS2, with the voltage at terminal N5 the same as the battery voltage and the voltage at N4 shifted to 190% of the battery voltage.

As the battery is charged, the storage capacitor C2 drops in charge level, and when it reaches 10% charge with a voltage of 110% of the battery voltage at terminal N4, the Op Amp OP1 output flips back up to the battery voltage. This cycle continuously repeats, with the microcontroller MC2 measuring the boundaries between the discharge and charge time periods that correspond to the flips in the Op Amp OP1 output. Using these times, the microcontroller MC2 calculates the SOC of the battery LS2. Intermittently, the microcontroller MC2 may close the switch SW1 to top-up the charge in the reservoir capacitor C1.

The inductor L1 and resistor R2 limit current surges into the storage capacitor C2, and in this embodiment have values of 1 uH and 0.03 Ohms respectively. This resistor R2 also acts as a balancing resistor that may be adjusted to provide an optimum time constant for measurement purposes, and will depend on the resolution and accuracy of the intended system and the number of battery cells connected in parallel. In this embodiment, the reservoir capacitor C1 is 1 F, and the storage capacitor C2 is 10 mF. In this embodiment, the resistors that form the difference amplifier together with the OP Amp OP1 have values of Rd1=12 KOhm, Rd2=1.2 KOhm, Rc1=10 KOhm, Rc2=1.1 KOhm. The diode D2 is considered to be an ideal diode with no voltage drop across it when conducting, however the resistances Rd1, Rd2, Rc1, Rc2 could be adjusted take to account of the voltage drop for a real-world diode, as will be apparent to those skilled in the art.

The internal resistance of the battery LS2 has been represented as being a fixed resistance of R1 for simplicity, however in reality the battery has an impulse response causing some variation in the effective resistance over the discharge/charge time periods. However, this does not detract from the relationship between the discharge/charge times and the SOC of the battery.

When the battery LS2 has a single cell at a state of charge of 50%, a typical value for the discharge time would be 2.74 ms, corresponding to the charging of the storage capacitor C2, and a typical value for the charge time would be 3.46 ms during discharging of the storage capacitor C2.

If 100 discharge/charge cycles are taken, then the accumulation of timings between the discharge periods (dp) 0.1T to 2.2T, charge periods (cp) 2.2T to 4.3T and overall period (op) 0.1T to 4.3T may provide values in this embodiment of 280 ms(dp), 300 ms(cp) and 580 ms(op) for an SOC of 20%, values of 267 ms(dp), 348 ms(cp) and 615 ms(op) for an SOC of 40%, and value of 280 ms(dp), 348 ms(cp) and 628 ms(op) for an SOC of 60%.

The discharge and charge resistances of a typical Lithium Sulfur battery will vary according to what temperature the battery is at. Therefore, if the battery management system is to work over a range of temperatures, then temperature-based modification of either the look-up table or of the times that are compared to the look up table is desirable. Accordingly, the microcontroller further comprises an input M2, which is connected to a temperature sensor TS1 of the battery management system. The temperature sensor TS1 is located close to the battery LS2, so it measures the temperature of the battery LS2.

Figure 5:
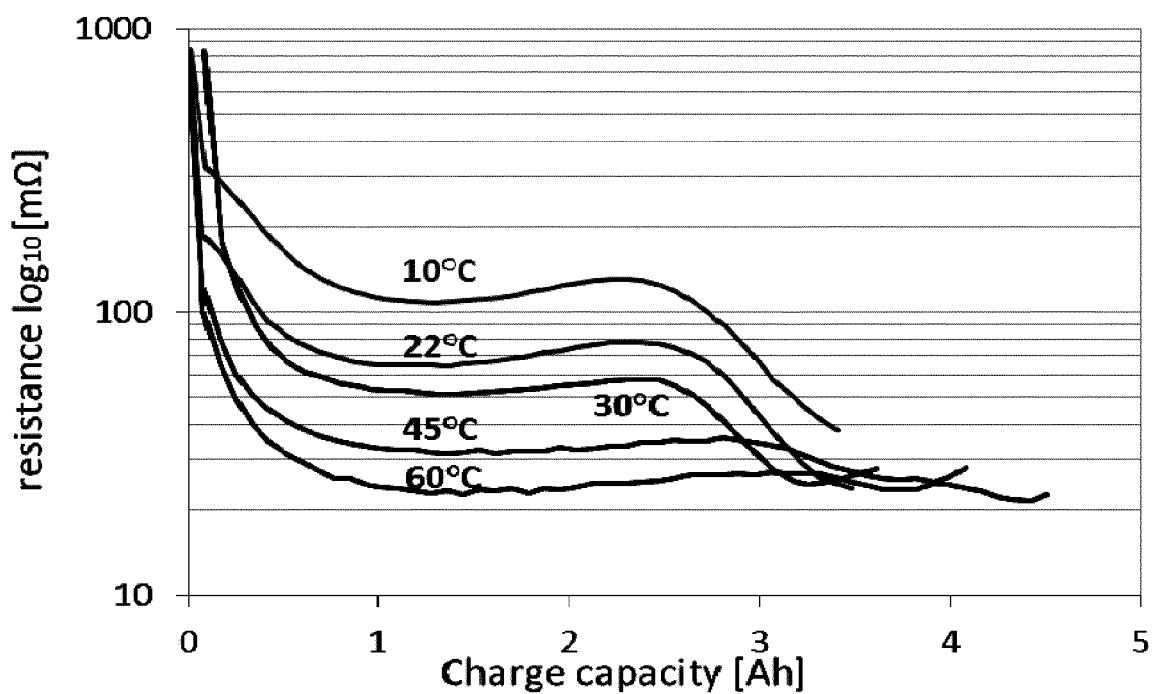
FIG. 5 shows a graph of battery resistance whilst charging a typical Lithium Sulfur battery, at various temperatures.
Figure 6:
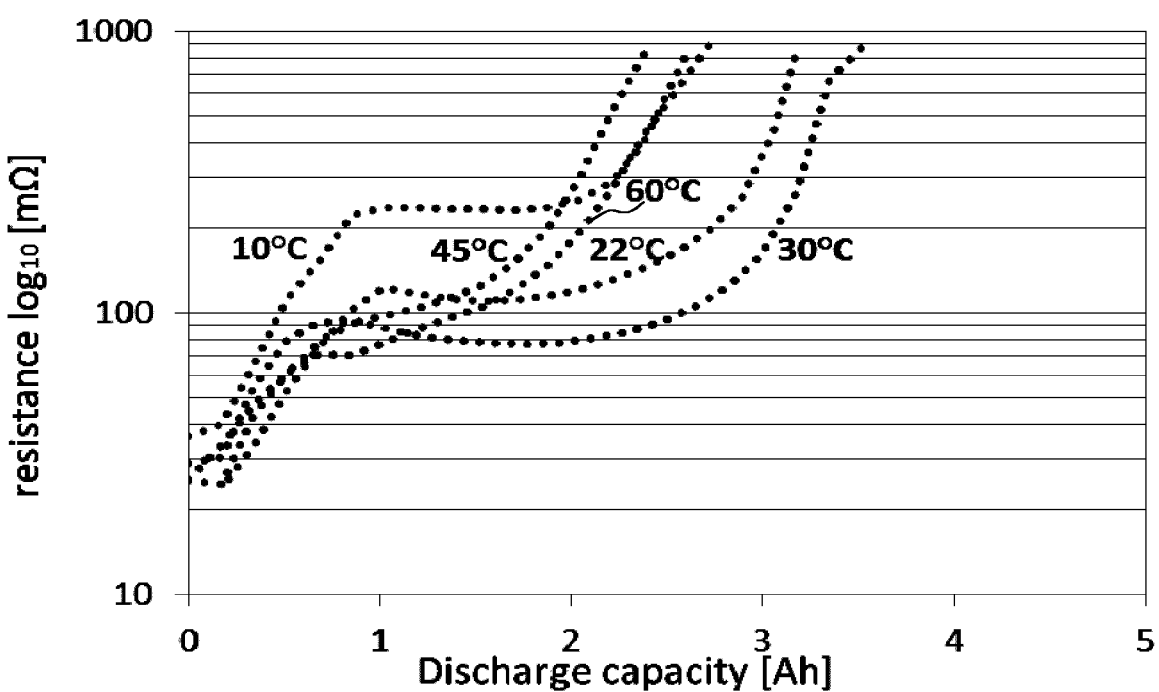
FIG. 6 shows a graph of battery resistance whilst discharging a typical Lithium Sulfur battery, at various temperatures.

The graph of FIG. 5 shows various curves at different temperatures, showing how the internal resistance of a typical Lithium Sulfur battery whilst charging varies as more and more charge is added to the battery. Additionally, the graph of FIG. 6 shows various curves at different temperatures, showing how the internal resistance of a typical Lithium Sulfur battery whilst discharging varies as more and more charge is discharged from the battery. Temperature clearly has a significant effect upon resistance, however the relationship between resistance and temperature is well-known in the art, and so the microcontroller MC2 can easily modify the measured discharge and charge times based on known relationships to compensate for temperature.

Using three sets of measurements taken at different states of charge, it may also be possible to compensate for changes in the battery's internal resistance due to temperature, ageing and external loading by comparing the absolute values of cp, dp and op against an ideal reference for any given state of charge. For example, it can be seen in the graphs of FIG. 4 and FIG. 5 that the resistance change with respect to temperature is greater for the battery when discharging, than what it is when charging. The rate with which the values change at specific temperatures may be used to indicate the state of health of the battery and in turn deterioration of the battery's capacity. An algorithm may be applied based on the temperature and values for cp, dp and op to compensate for an Li—S battery's change in capacity due to temperature, and against ideal values for a change in capacity due to battery ageing or loading.

Furthermore, given that the resistance of the battery can be further measured as a function of the magnitude of the load applied and frequency with which it is applied, the values of C2 and/or L1 may be varied to alter the impulse load seen by the battery and the discharge/charge frequency to produce different sets of measurement results. For example, variable components may be used for C2 and/or L1, or additional circuits with C2 and/or L1 set at different values could be incorporated in the battery management system. The results obtained by these additional measurement results could be used to improve the accuracy, validate the original measurement results, and more specifically allow effects of temperature and battery ageing to be compensated for by validating the resistance variations as seen by the variable loading conditions of the multiple circuits. For example, C2 could be set at 10 mF for a first set of measurements, and then at 20 mF for a second set of measurements.

Figure 7:
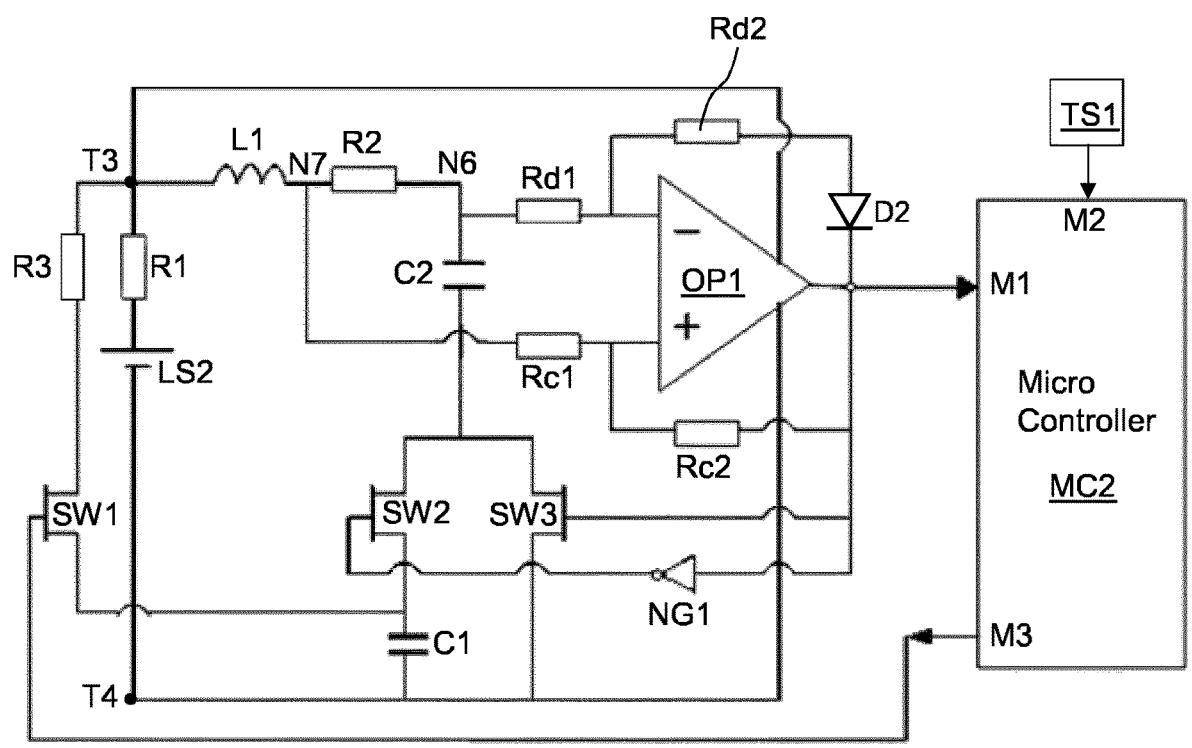
FIG. 7 shows a schematic diagram of a battery management system according to a third embodiment of the invention.

A third embodiment of the invention is shown in FIG. 7, and this is the same as the second embodiment, except for that the difference amplifier formed by the OP Amp OP1 measures the voltage between the terminals N6 and N7 of the resistor R2. Therefore, the resistor R2 acts as a current sense resistor, and allows the current flowing in and out of the capacitor C2 to be measured. During discharge of the battery LS2, the terminal N7 is at a higher voltage than N6, however when the current level drops sufficiently as the storage capacitor reaches 90% charge, the Op Amp OP1 output transitions from the battery voltage to 0V, commencing the charge of the battery LS2. The terminal N6 is at a higher voltage than N7, however when the current level drops sufficiently as the storage capacitor falls to 10% charge, the Op Amp OP1 output transitions from 0V up to the battery voltage, starting the discharge period. The microcontroller MC2 measures the transitions in the Op Amp output at the input M1, in the same manner as previously described in the second embodiment.

It will be appreciated that many other arrangements of reactive elements could be implemented to provide circuits having measurable discharge/charge periods, and that voltages between various points of these circuits could be measured to determine discharging/charging of fixed amounts of charge from and to the battery through these circuits.

Many other variations of the described embodiments falling within the scope of the invention will be apparent to those skilled in the art.

The invention claimed is:

1. A Lithium-Sulfur battery management system for determining a state of charge of a Lithium-Sulfur battery, the management system comprising a first circuit having at least one reactive element, the first circuit configured to discharge and charge fixed amounts of charge from and to the battery via the at least one reactive element, and second circuit for monitoring the discharging and charging, wherein the second circuit is configured to measure a discharge time and a charge time of the fixed amounts of charge, and determine the state of charge based on those times.

2. The Lithium-Sulfur battery management system of claim 1, wherein the at least one reactive element comprises a storage capacitor, and wherein a size of the storage capacitor fixes the fixed amounts of charge that are discharged from and charged to the battery.

3. The Lithium-Sulfur battery management system of claim 2, wherein the at least one reactive element comprises an inductor connected to the storage capacitor.

4. The Lithium-Sulfur battery management system of claim 2, wherein the first circuit comprises a switching network connected to the storage capacitor, the switching network configured to switch a first terminal of the storage capacitor between lower and higher voltage potentials to perform the discharging and charging of the battery via a second terminal of the storage capacitor.

5. The Lithium-Sulfur battery management system of claim 4, wherein the first circuit comprises a reservoir capacitor, and wherein the switching network is configured to switch the reservoir capacitor out of and into series with the storage capacitor to perform the discharging and charging of the battery respectively.

6. The Lithium-Sulfur battery management system of claim 5, wherein the first circuit comprises a switch for charging the reservoir capacitor with the battery, prior to the switching of the reservoir capacitor out of and into series with the storage capacitor to perform the discharging and charging of the battery.

7. The Lithium-Sulfur battery management system of claim 6, wherein the second circuit is configured to monitor a voltage difference between two points of the first circuit, determine that discharging or charging is sufficiently complete when the voltage difference drops below a predetermined level, and in response switch the first circuit from discharging to charging, or from charging to discharging, respectively.

8. The Lithium-Sulfur battery management system of claim 7 when appended to claim 6, wherein the second circuit comprises a difference amplifier for determining the voltage difference between the two points, and wherein an output of the difference amplifier is connected to a control terminal of the switching network, to switch between discharging and charging the battery based on the output of the difference amplifier.

9. The Lithium-Sulfur battery management system of claim 8, wherein the second circuit is configured to determine the state of charge based on a look-up table that provides a state of charge value for each of multiple combinations of discharge and charge times.

10. The Lithium-Sulfur battery management system of claim 9 when appended to claim 8, wherein the second circuit comprises a microcontroller configured to time the discharge and charge times based on the output of the difference amplifier, and determine the state of charge based on the look-up table.

11. The Lithium-Sulfur battery management system of claim 10, wherein the second circuit is configured to repeatedly switch the first circuit to discharge and charge the battery for a repetition number of times, and determine the state of charge based on a sum of the discharge times, a sum of the charge times, and optionally a sum of the discharge and charge times.

12. The Lithium-Sulfur battery management system of claim 11, wherein the second circuit is configured to determine a health of the battery based on the sum of the discharge and charge times.

13. The Lithium-Sulfur battery management system of claim 12, further comprising a third circuit configured to sense a temperature of the battery, wherein the second circuit is configured to determine the state of charge further based on the temperature of the battery.

14. The Lithium-Sulfur battery management system of claim 13, wherein the fixed amounts of charge comprise a first fixed amount of charge that is discharged from the battery during the discharge time, and a second fixed amount of charge that is charged into the battery during the charge time, wherein the first fixed amount of charge and the second fixed amount of charge are substantially a same value as one another such that the discharging and charging has no significant overall effect upon the state of charge of the battery.

15. A method for determining state of charge of a Lithium-Sulfur battery, comprising:
    measuring a first time to discharge the Lithium-Sulfur battery by a first fixed amount of charge, via a first reactive element;
    measuring a second time to charge the Lithium-Sulfur battery by second fixed amount of charge, via a second reactive element; and
    determining the state of charge based on the first and second times, wherein the first reactive element is optionally a same reactive element as the second reactive element, and wherein the first fixed amount of charge is optionally a same amount of charge as the second fixed amount of charge.

* * * * *